(12) United States Patent
Wu et al.

(10) Patent No.: US 7,701,055 B2
(45) Date of Patent: Apr. 20, 2010

(54) LIGHT EMITTER ASSEMBLY

(75) Inventors: Kai Chiu Wu, Tsuen Wan (HK); Ming Lu, Sijhih (TW); Chak Hau Pang, Fanling (HK)

(73) Assignee: Hong Applied Science and Technology Research Institute Company Limited, Shatin, New Territories (HK)

( * ) Notice: Subject to any disclaimer, the term of this patent is extended or adjusted under 35 U.S.C. 154(b) by 337 days.

(21) Appl. No.: 11/700,349

(22) Filed: Jan. 30, 2007

(65) Prior Publication Data

US 2008/0121900 A1    May 29, 2008

(30) Foreign Application Priority Data

Nov. 24, 2006   (HK)   ................................ 06112953.4

(51) Int. Cl.
*H01L 23/34* (2006.01)
(52) U.S. Cl. .................. 257/712; 257/625; 257/707; 257/718; 257/720; 257/E33.075
(58) Field of Classification Search ................ 257/625, 257/707, 712, 720, 718
See application file for complete search history.

(56) References Cited

U.S. PATENT DOCUMENTS

| | | | |
|---|---|---|---|
| 5,577,832 A | 11/1996 | Lodhie | |
| 6,598,996 B1 | 7/2003 | Lodhie | |
| 6,609,816 B2 | 8/2003 | Ansari et al. | |
| 6,787,999 B2 | 9/2004 | Stimac et al. | |
| 6,815,724 B2 | 11/2004 | Dry | |
| 6,827,469 B2 | 12/2004 | Coushaine et al. | |
| 6,880,956 B2 | 4/2005 | Zhang | |
| 6,949,772 B2 | 9/2005 | Shimizu et al. | |
| 6,991,355 B1 | 1/2006 | Coushaine et al. | |
| 7,040,790 B2 | 5/2006 | Lodhie et al. | |
| 7,045,828 B2 | 5/2006 | Shimizu et al. | |
| 7,059,748 B2 | 6/2006 | Coushaine et al. | |
| 7,250,637 B2 | 7/2007 | Shimizu et al. | |
| 7,252,405 B2 | 8/2007 | Trenchard et al. | |
| 7,259,403 B2 | 8/2007 | Shimizu et al. | |
| 7,355,856 B2 * | 4/2008 | Petroski ..................... 361/710 |
| 7,375,381 B2 | 5/2008 | Shimzu et al. | |

(Continued)

FOREIGN PATENT DOCUMENTS

CN    2485801    6/2001

(Continued)

OTHER PUBLICATIONS

U.S. Appl. No. 60/830,110; filed Jul. 12, 2006; LED Assembly and Use Thereof; Ming Lu et al.; 16 pp.

(Continued)

*Primary Examiner*—Wai-Sing Louie
(74) *Attorney, Agent, or Firm*—Wells St. John, P.S.

(57) ABSTRACT

A plurality of disc-shaped substrates carry light emitters and are axially stacked, spaced apart, in a metal housing to dissipate the heat produced by the light emitters. The housing comprises mutually connected elongate planar ribs that abut the light emitters or substrates for thermally connecting the light emitters to the housing. The ribs have shoulders. The substrates are received between the ribs and abut the shoulders. The shoulders are positioned proximate each light emitter in intimate contact with the substrate for efficient heat dissipation.

34 Claims, 5 Drawing Sheets

U.S. PATENT DOCUMENTS

| | | |
|---|---|---|
| 2003/0189829 A1 | 10/2003 | Shimizu et al. |
| 2004/0066142 A1 | 4/2004 | Stimac et al. |
| 2004/0222516 A1* | 11/2004 | Lin et al. .................. 257/712 |
| 2005/0207165 A1 | 9/2005 | Shimizu et al. |
| 2005/0237747 A1 | 10/2005 | Shimizu et al. |
| 2005/0242362 A1 | 11/2005 | Shimizu et al. |
| 2005/0243559 A1 | 11/2005 | Coushaine et al. |
| 2006/0160409 A1 | 7/2006 | Shimizu et al. |
| 2007/0187708 A1 | 8/2007 | Setomoto et al. |
| 2007/0222516 A1* | 9/2007 | Seaberg .................. 330/257 |
| 2007/0253218 A1 | 11/2007 | Tanabe |
| 2008/0013334 A1* | 1/2008 | Lu et al. .................... 362/545 |

FOREIGN PATENT DOCUMENTS

| | | |
|---|---|---|
| CN | 2644878 | 8/2003 |
| CN | 1464953 | 12/2003 |
| CN | 1693750 | 9/2005 |
| CN | 1689376 | 10/2005 |
| JP | 2006-049026 | 2/2006 |
| JP | 2006-100052 | 4/2006 |
| WO | WO 2006027883 | 3/2006 |

OTHER PUBLICATIONS

International Search Report Application No. PCT/CN2007/071415 dated Apr. 10, 2008.

* cited by examiner

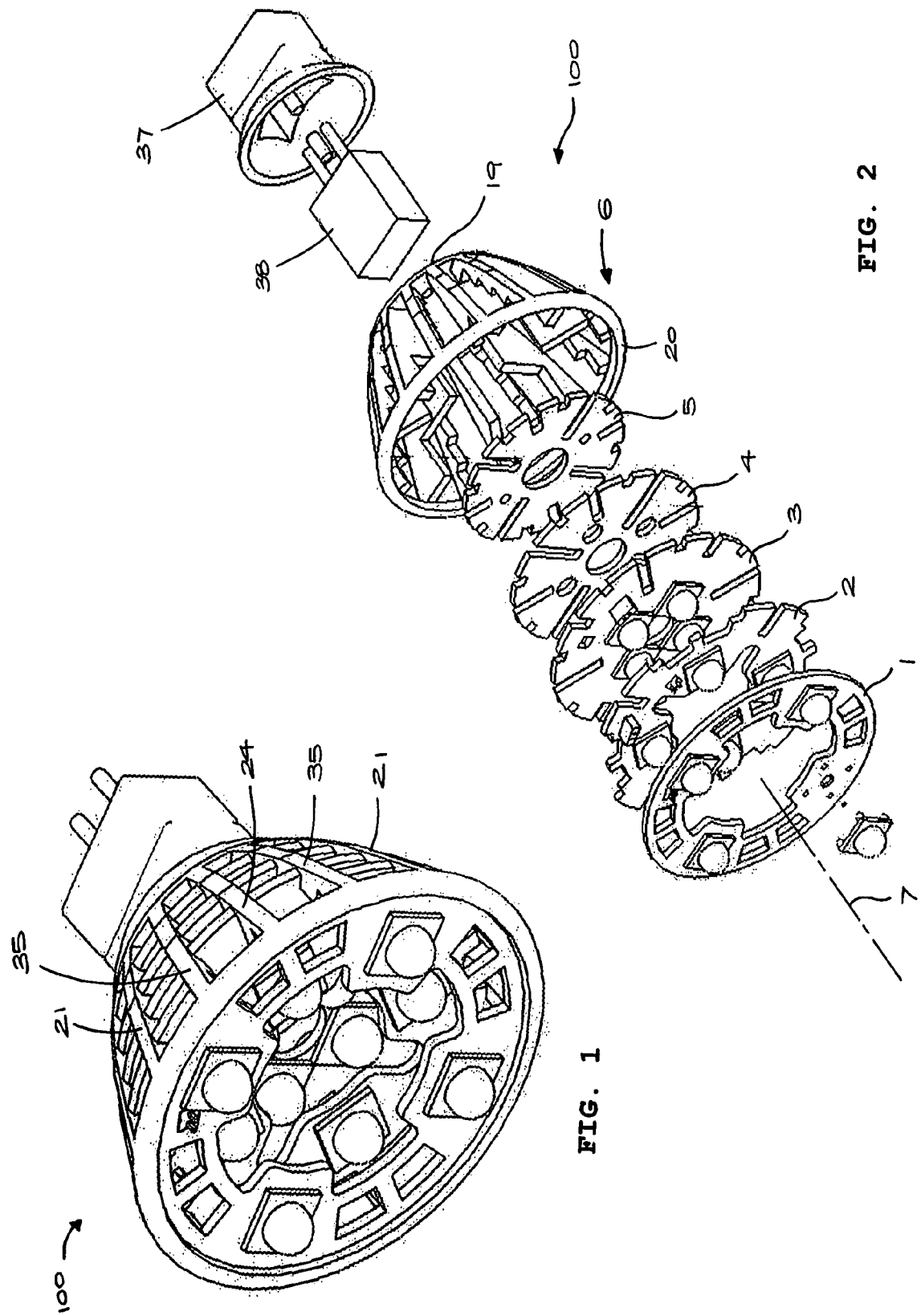

LIGHT EMITTER ASSEMBLY

PRIOITY CLAIM

This patent claims priority from the earlier filed Hong Kong Patent Application No. 06112953.4 filed Nov. 24, 2006, by inventors Kai Chiu Wu, Ming Lu, and Chak Hau Pang.

TECHNICAL FIELD

This invention relates to light emitting assemblies having heat dissipating supports for reducing the operating temperature of the assembly.

BACKGROUND OF THE INVENTION

Light sources comprising assemblies of light emitters such as light emitting diodes (LEDs) are finding increasing application in mass production applications because of their high efficiency and long life. One such application is light sources for replacing florescent and incandescent lights and the like.

High output LEDs, particularly when a large number are used on a common support, produce a significant amount of heat. If elevated temperatures are then produced, the life of the LEDs is reduced. In practice, it is desirable that the LED be placed into contact with heat dissipation surfaces to effectively cool the LED. One such arrangement is described in the applicant's pending application No. 60/830,110. While this device performs satisfactorily, it will be appreciated that there is an ongoing need for an improved assembly capable of mounting a large number of light emitters and one which can be produced economically. The assembly should include a great deal of heat transfer potential in addition to providing a means for further incorporating the light emitter into the circuitry of an overall lighting assembly.

DISCLOSURE OF THE INVENTION

According to one aspect of the invention there is provided a light emitter assembly, comprising:

a substrate carrying a plurality of light emitters, and a housing including mutually connected thermally conductive ribs spaced apart for air flow therebetween, the substrate supported generally transversely between the ribs, the ribs abutting the light emitters or substrate for thermally connecting the light emitters or substrate to the housing.

In another aspect the invention provides a light emitter assembly, comprising:

first and second substrates carrying first and second pluralities of light emitters respectively, a housing including mutually connected metal ribs spaced apart for air flow therebetween, both substrates extending generally transversely between the ribs with the second substrate spaced apart from the first substrate for air flow therebetween, the ribs having shoulders abutting the light emitters or substrates and thermally connecting the light emitters to the housing.

Preferably the substrates are formed of sheet material, each substrate having a respective peripheral edge and respective planar inner and outer faces, the outer faces being aligned generally parallel, the ribs surrounding the peripheral edges of the substrates, the first substrate having a recess such that light emitted outward from each of the second plurality of light emitters in a direction perpendicular to the outer faces passes through the recess and is not occluded by the first substrate.

Preferably a mounting portion of each outer face abuts each light emitter, and one of said shoulders abuts a portion of the inner face opposite each mounting portion.

Preferably the ribs extend radially relative to a central axis of the housing and are mutually connected at the longitudinally inner ends thereof. In a preferred embodiment the ribs are also mutually connected by a ring portion at the longitudinally outer ends thereof.

The first and second pluralities of light emitters are preferably mounted substantially upon respective first and second pitch circles centred on the central axis, the diameter of the first pitch circle exceeding the diameter of the second pitch circle, the light emitters of the first plurality being circumferentially offset relative to the light emitters of the second plurality.

The substrates are preferably ring shaped, most preferably being formed from planar sheet material.

The assembly preferably further includes at least one generally transversely extending metal heat dissipation member connected to the ribs intermediate the inner and outer ends. Preferably the heat dissipation member is slotted to receive and engage each of the ribs.

The housing preferably has a substantially frustoconical periphery defined by the circumferentially spaced radially outermost edges of the ribs.

In another aspect the invention provides a light emitter assembly, comprising:

first and second substrates carrying first and second pluralities of light emitters respectively, a housing including mutually connected metal ribs spaced apart for air flow therebetween and extending between an inner and an outer end of the housing, wherein the substrates extend generally transversely between the ribs, the second substrate being spaced apart inwardly from the first substrate for air flow therebetween, the first substrate having a recess such that light emitted outward from each of the second plurality of light emitters in the longitudinal direction faces passes through the recess and is not occluded by the first substrate, and the ribs abutting the light emitters or substrates for thermally connecting the light emitters to the housing.

This invention provides an light emitter assembly having satisfactory light dispersion or radiation pattern and a simple design with a reduced number of parts to minimize manufacturing costs. Heat is efficiently dispersed into the housing and the spacings between the ribs of the housing, as well as between the substrates themselves, enhance the heat transfer rate through natural convection in different orientations of the assembly.

BRIEF DESCRIPTION OF THE DRAWINGS

Preferred forms of the present invention will now be described by way of example with reference to the accompanying drawings, wherein:

FIG. 1 is a pictorial view of an light emitter assembly of the present invention;

FIG. 2 is an exploded view of the assembly of FIG. 1;

DESCRIPTION OF THE PREFERRED EMBODIMENTS

Figure 3:
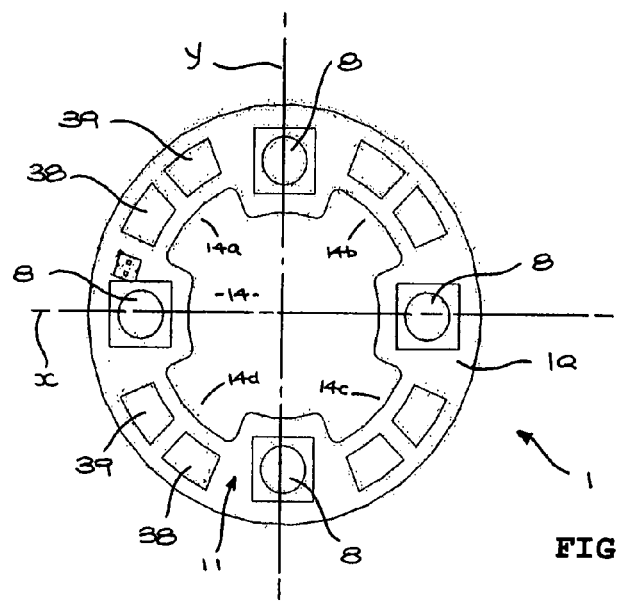
FIGS. 3-5 are outer end views of substrates of the assembly of FIG. 1.
Figure 4:
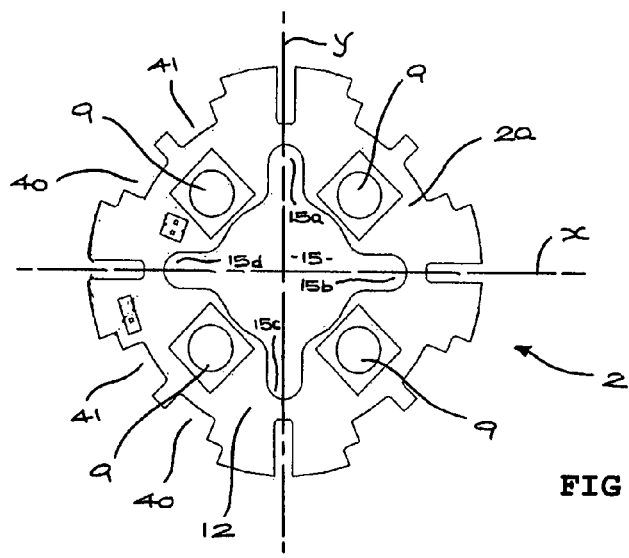
Figure 5:
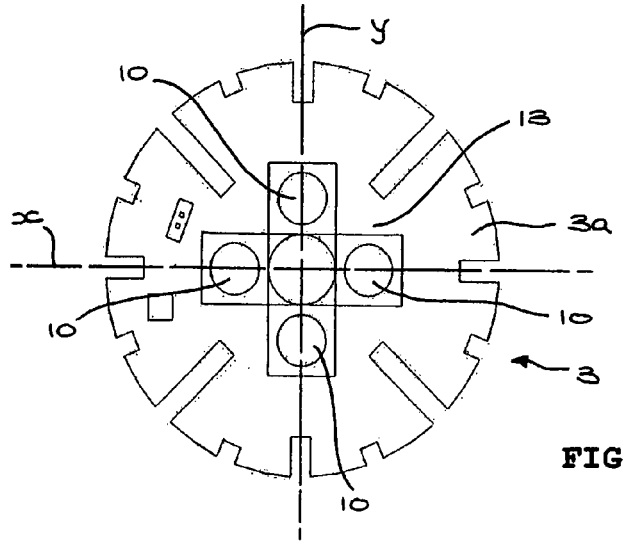
Figure 6:
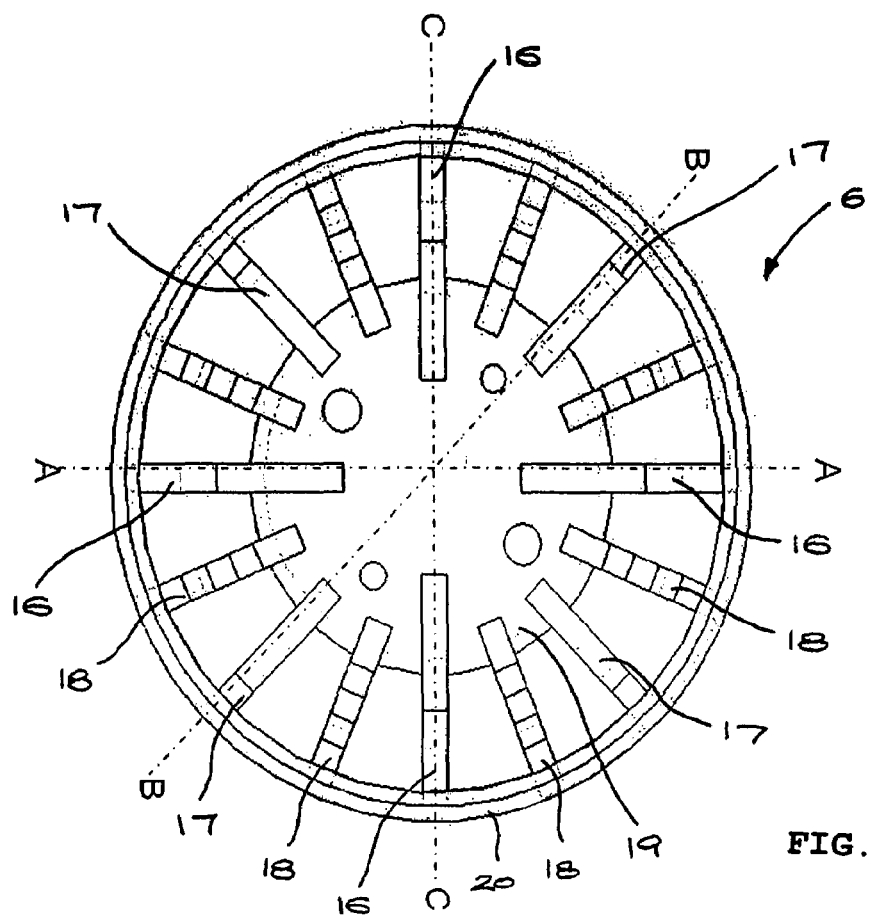
FIG. 6 is an end view of the housing of the assembly of FIG. 1.

Referring to FIGS. 1 and 2, a light emitter assembly 100 includes three light emitter substrates 1, 2, 3 and two heat dissipating members 4, 5 which are stacked in a housing 6. The components 1-5 are substantially parallel, extending transversely relative to a central longitudinal axis 7. In the embodiment illustrated the LED substrates 1, 2, 3 and heat dissipating members 4, 5 are in a generally planar ring shape, but it will be understood that different shapes will be equally applicable depending upon the required application of the assembly.

Each LED substrate 1, 2, 3 has an outer surface 1a, 2a, 3a and an opposing inner surface 1b, 2b, 3b. Four LEDs 8, 9, 10 are mounted on the respective outer surfaces 1a, 2a, 3a equally angularly spaced on respective pitch circles 11, 12, 13 centred on the central axis 7 and emitting light substantially parallel to the axis 7.

The LEDs on the three substrates 1, 2, 3 are offset radially, the pitch circle diameter 11 exceeding pitch circle diameter 12, and pitch circle diameter 12 exceeding pitch circle diameter 13. The LEDs of adjacent pairs of substrates 1, 2 and 2, 3 are circumferentially offset by 45°. Substrate 1 has a central recess 14 with four indentations 14a-14d circumferentially offset by 45° from the LEDs 8 for registration with the LEDs 9, such that light emitted outward from each of the LEDs 9 is not occluded by the substrate 1. Likewise, substrate 2 has a recess 15 with four equally angularly spaced indentations 15a-15d for axial registration with the LEDs 10. In this manner the LEDs 8, 9, 10 are not blocked by each other or the substrates. Alternatively, transparent windows or substrates may be used for enhancing light emission efficiency in alternate embodiments.

In the embodiment shown, each substrate 1, 2, 3 is formed with a thermally conductive material such as metal-core printed circuit board (MC-PCB) or ceramic based substrate, for assisting heat distribution in each substrate. The MC-PCBs or ceramic based substrates are patterned to provide electrical paths (not shown) thereon for powering the LEDs as generally understood by those skilled in the art.

Referring to FIGS. 6-10, the housing 6 is a one-piece metal component, for example, of die-cast aluminium or magnesium for good thermal conductivity. The housing 6 generally comprises substantially planar and radially aligned ribs 16, 17, 18 elongated to join a disc-shaped inner portion 19 to an outer ring 20.

Four ribs 16 are equally angularly spaced, each having a radially outermost edge 21, an inner shoulder 22 and an outer shoulder 23. Each of the shoulders 22, 23 has a respective transversely aligned shoulder surface 22a, 23a. The substrate 1 abuts the shoulder surface 23a below the LEDs 8 and the substrate 3 abuts the shoulder surfaces 22a below the LEDs 10.

Angularly offset from ribs 16 by 45° are four ribs 17 that are also are equally angularly spaced. Each rib 17 has a radially outermost edge 24, an inner shoulder 25 and an outer shoulder 26. Each of the shoulders 25, 26 has a respective transversely aligned shoulder surface 25a, 26a. The substrate 1 abuts the shoulder surfaces 25a and the substrate 2 abuts the shoulder surfaces 26a below the LEDs 9.

Figure 7:
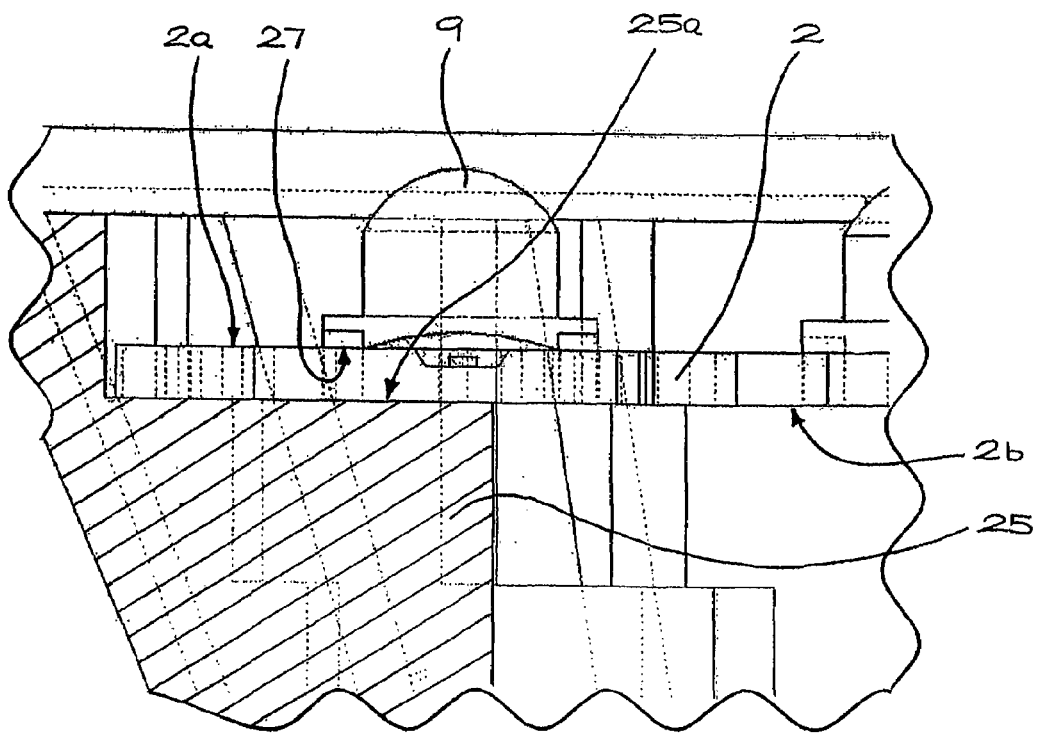
FIG. 7 is an enlarged section illustrating the connection between a rib and substrate.
Figure 8:
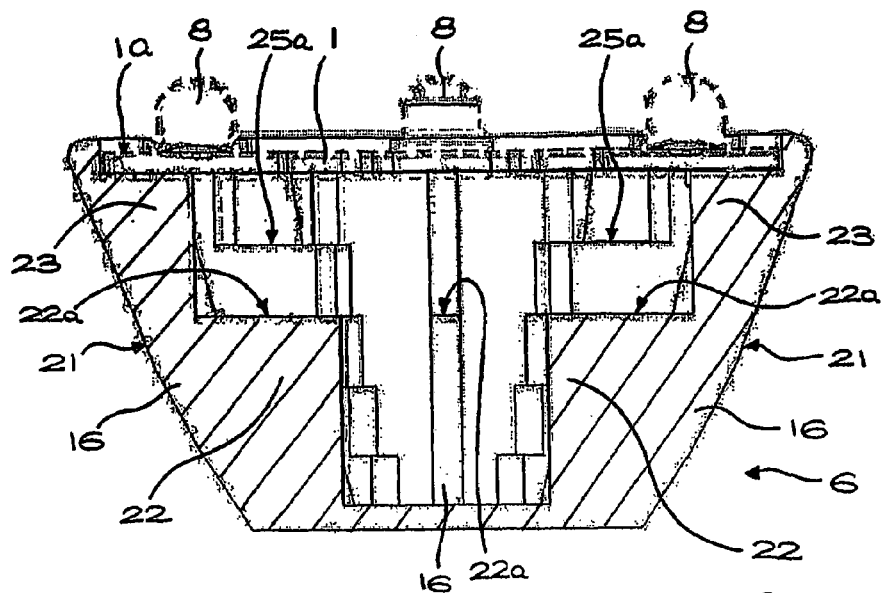
FIG. 8 is a section along line AA of FIG. 6 showing an outer substrate in dashed outline.
Figure 9:
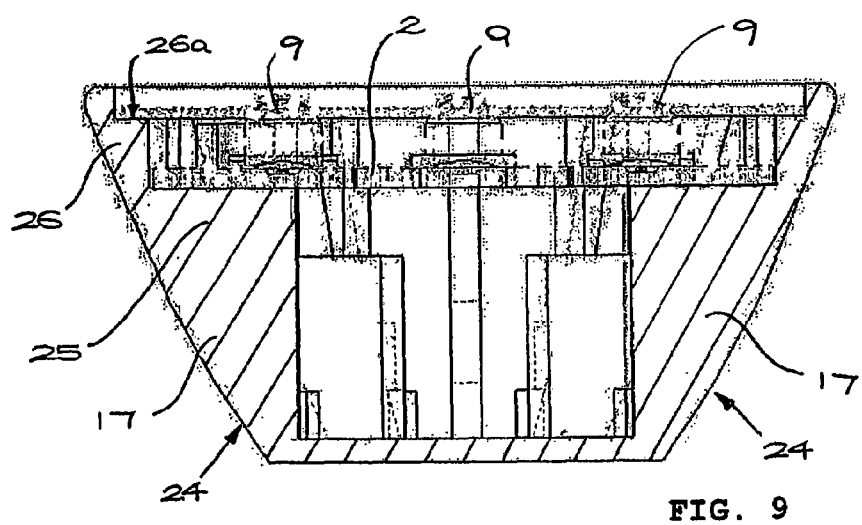
FIG. 9 is a section along line BB of FIG. 6 showing an inner substrate in dashed outline.
Figure 10:
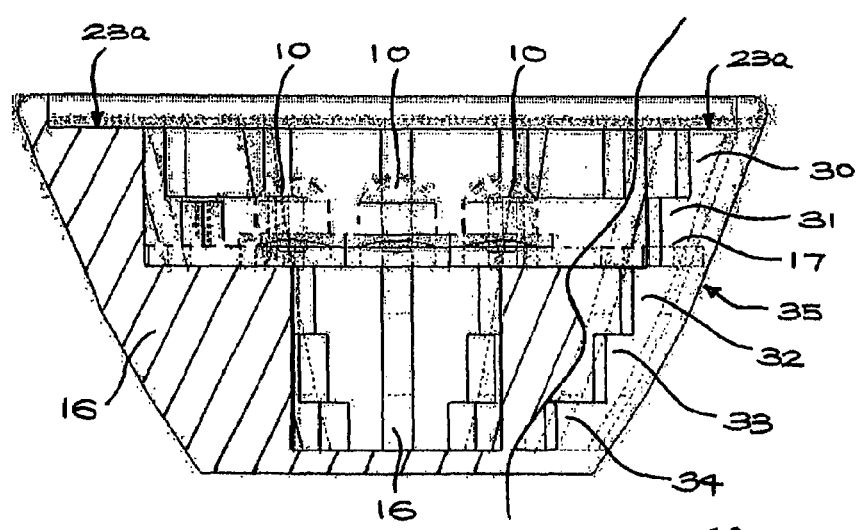
FIG. 10 is a section along line CC of FIG. 6 showing an intermediate substrate in dashed outline.

FIG. 7 illustrates the mounting portion 27 of outer face 2a which abuts each LED 9, by way of an illustration of the way all the heat dissipating ribs 16, 17 are fixed adjacent a respective LED. The shoulder surface 25a abuts the inner face 2b opposite each mounting portion 27 and is fixed by a thermally conductive adhesive for allowing efficient thermal connection between the ribs and the substrates. Optionally mechanical fasteners may also be used for joining the substrates and ribs.

Eight ribs 18 are equally angularly spaced, each having a radially outermost edge 35, and shoulders 30-34. The shoulders 30, 31, 32 abut the substrates 1, 2, 3 respectively and the shoulders 33, 34 abut the metal members 4, 5 and are likewise preferably fixed by thermally conductive adhesive. Each member 4, 5 extends transversely and is radially notched for receiving the ribs 16, 17, 18. With the substrates 1, 2, 3 and members 4, 5 physically spaced apart by a gap, more efficient thermal dissipation from the substrate to the environment, for example air surrounding the substrates, can be achieved. With the substrates thermally connected, heat will be transferred from a substrate of a higher temperature to a substrate of a lower temperature, and therefore more even thermal distribution among the substrates can be achieved.

The ribs 16, 17, 18 are splayed apart in the longitudinal direction, the housing 6 having a substantially frustoconical periphery defined by the circumferentially spaced radially outermost edges 21, 34, 35 of the ribs 16, 17, 18. Fixed to the inner portion 19 is a hollow mounting fitting 37 which receives the electrical circuit 38 for supplying power to the LEDs 8, 9, 10.

Apertures 38, 39 in the substrate 1 are positioned between each LED 8 and are axially aligned with recesses 40, 41 in the substrate 2 for enhancing air flow through the substrates. The apertures 38-14 and the spacing between the ribs 16-18 provides satisfactory air flow and consequently enhance the thermal dissipation efficiency, regardless of the orientation of the assembly 100.

Figure 11:
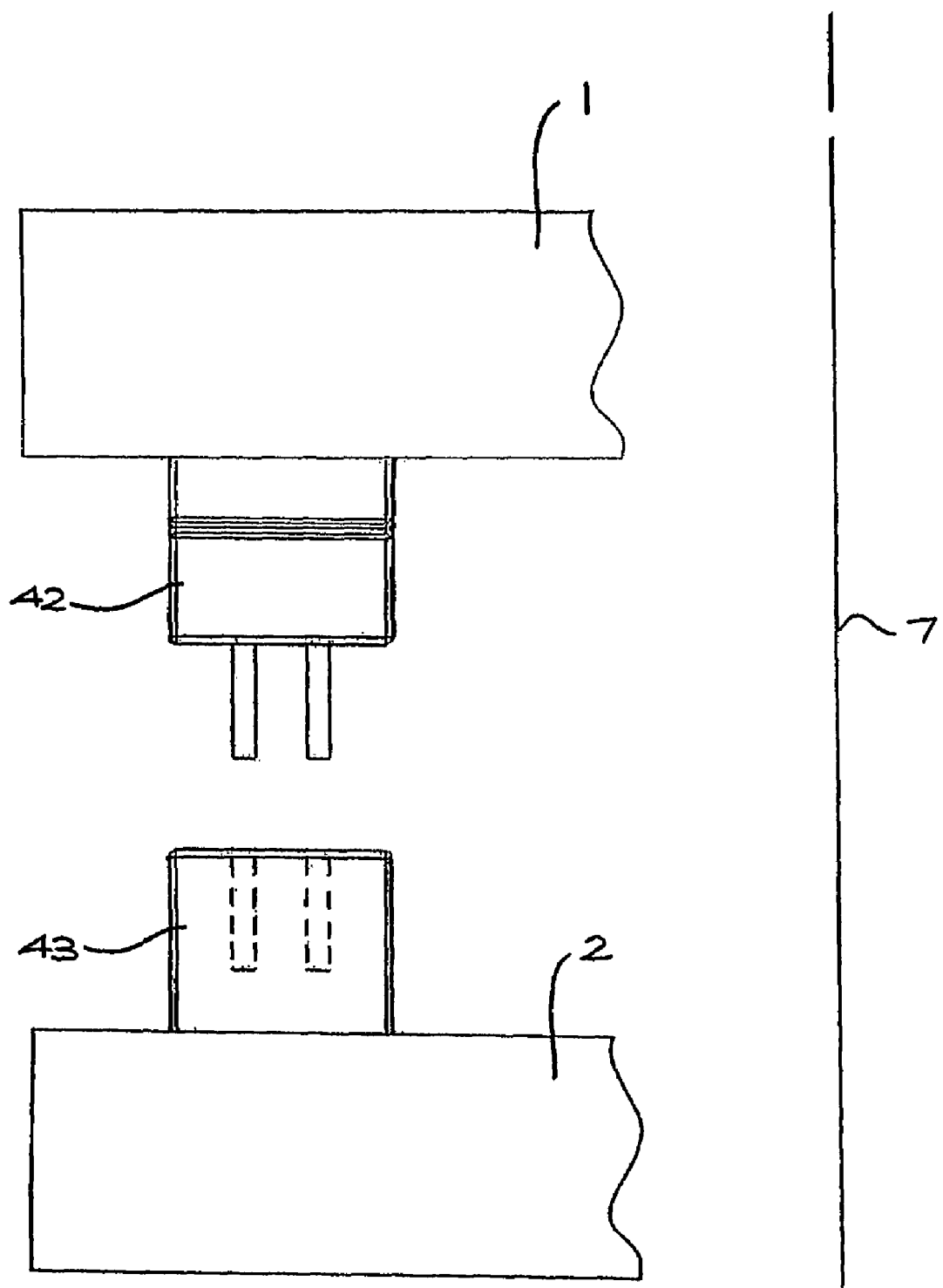
FIG. 11 is detail of the electrical connection between the substrates.

With the axial assembly of the substrates 1, 2, 3 into the housing, axially aligned pin-and-socket type connectors 42, 43, as shown in FIG. 11 may provide the electrical connection between the substrates 1, 2, 3.

Aspects of the present invention have been described by way of example only and it should be appreciated that modifications and additions may be made thereto without departing from the scope thereof.

The invention claimed is:

1. A light emitter assembly, comprising:
   a substrate carrying a plurality of light emitters, and
   a housing including mutually connected thermally conductive ribs spaced apart for air flow therebetween, the substrate supported generally transversely between the ribs, the ribs abutting the light emitters or substrate and configured to thermally connect the light emitters or substrate to the housing.

2. The assembly of claim 1 wherein the ribs have shoulders abutting the light emitters or substrate.

3. The assembly of claim 2 wherein the substrate includes a thermally conductive core, one of the shoulders abutting the substrate adjacent each emitter for thermally connecting each light emitter to the housing.

4. The assembly of claim 3 further including at least one thermally conductive heat dissipation member fixed to the ribs and extending generally transversely between the ribs adjacent the substrate, the member being spaced apart from the adjacent substrate for air flow therebetween.

5. The assembly of claim 4 wherein the ribs and each heat dissipation member are metal, the member abutting shoulders on the ribs.

6. A light emitter assembly, comprising:
   first and second substrates carrying first and second pluralities of light emitters respectively, a housing including mutually connected metal ribs spaced apart for air flow therebetween, the substrates extending generally transversely between the ribs with the second substrate spaced apart from the first substrate for air flow therebetween, the ribs having shoulders abutting the light emitters or substrates and configured to thermally connect the light emitters or substrates to the housing.

7. The assembly of claim 6 wherein each substrate has a respective peripheral edge and respective planar inner and outer face, the outer faces being aligned generally parallel, the ribs surrounding the peripheral edges of the substrates, the first substrate having a recess such that light emitted outward from each of the second plurality of light emitters in a direction perpendicular to the outer faces passes through the recess and is not occluded by the first substrate.

8. The assembly of claim 7 wherein a mounting portion of each outer face abuts each light emitter, and one of said shoulders abuts a portion of the inner face opposite each mounting portion.

9. The assembly of claim 8 wherein the ribs extend radially relative to a central axis of the housing and are mutually connected at the longitudinally inner ends thereof.

10. The assembly of claim 9 wherein the ribs are mutually connected by a ring portion at the longitudinally outer ends thereof.

11. The assembly of claim 6 wherein the first and second pluralities of light emitters are mounted substantially upon respective first and second pitch circles centred on the central axis, the diameter of the first pitch circle exceeding the diameter of the second pitch circle, the light emitters of the first plurality being circumferentially offset relative to the light emitters of the second plurality.

12. The assembly of claim 6 wherein the substrates are ring shaped.

13. The assembly of claim 12 wherein the substrates are formed from planar sheet material.

14. The assembly of claim 1 further including at least one generally transversely extending metal heat dissipation member connected to the ribs and spaced apart from the adjacent substrate for air flow there between.

15. The assembly of claim 14 wherein each the heat dissipation member is substantially planar and abuts the shoulders.

16. The assembly of claim 15 wherein the heat dissipation member is slotted to receive and engage each of the ribs.

17. The assembly of claim 6 wherein the housing has a substantially frustoconical periphery defined by the circumferentially spaced radially outermost edges of the ribs.

18. A light emitter assembly, comprising:
first and second substrates carrying first and second pluralities of light emitters respectively,
a housing including mutually connected metal ribs spaced apart for air flow therebetween and extending between an inner and an outer end of the housing, wherein
the substrates extend generally transversely between the ribs, the second substrate being spaced apart inwardly from the first substrate for air flow therebetween, the first substrate having a recess such that light emitted outward from each of the second plurality of light emitters in the longitudinal direction faces passes through the recess and is not occluded by the first substrate, and the ribs abutting the light emitters or substrates and configured to thermally connect the light emitters or substrates to the housing.

19. The assembly of claim 18 wherein shoulders formed on the ribs abut the light emitters or substrates for thermally connecting the light emitters to the housing.

20. The assembly of claim 18 wherein the substrate has opposing inner and outer faces, a mounting face portion of the outer face abuts each light emitter, and one of the shoulders abuts a portion of the inner face opposite each mounting portion.

21. The assembly of claim 18 wherein shoulders are formed on the ribs, the substrate has opposing inner and outer faces, a mounting face portion of the outer face abuts each light emitter, and one of the shoulders abuts a portion of the inner face opposite each mounting portion.

22. The assembly of claim 21 wherein the ribs are splayed apart in a longitudinal direction and each substrate has a peripheral edge; the ribs surrounding the peripheral edges of the substrates.

23. The assembly of claim 22 wherein the ribs extend radially relative to a central longitudinal axis of the housing and are mutually connected at the inner ends thereof.

24. The assembly of claim 22 wherein the ribs are mutually connected by a ring portion at the longitudinally outer ends thereof.

25. The assembly of claim 22 wherein the first and second pluralities of light emitters are mounted substantially upon respective first and second pitch circles centred on the central axis, the diameter of the first pitch circle exceeding the diameter of the second pitch circle, and the light emitters of the first plurality being circumferentially offset relative to the light emitters of the second plurality.

26. The assembly of claim 24 wherein the substrates are ring shaped.

27. The assembly of claim 26 wherein the substrates are formed from planar sheet material.

28. The assembly of claim 18 further including at least one generally transversely extending metal heat dissipation member connected to the ribs intermediate the inner and outer ends.

29. The assembly of claim 28 wherein each the heat dissipation member is substantially planar and abuts the shoulders.

30. The assembly of claim 28 wherein the heat dissipation member is slotted to receive and engage each of the ribs.

31. The assembly of claim 22 wherein the housing has a substantially frustoconical periphery defined by the circumferentially spaced radially outermost edges of the ribs.

32. The assembly of claim 1 wherein the housing is configured to receive the substrate, wherein the mutually connected thermally conductive ribs are spaced apart about a periphery of the substrate so as to permit the air flow between adjacent ones of the ribs, and wherein the ribs are elongate and the substrate extends generally transversely between the ribs.

33. The assembly of claim 6 wherein the housing is configured to receive the substrates, and wherein the mutually connected metal ribs are spaced apart about peripheries of the substrates so as to permit the air flow between adjacent ones of the ribs.

34. The assembly of claim 18 wherein the housing is configured to receive the substrates, and wherein the mutually connected metal ribs are spaced apart about peripheries of the substrates so as to permit the air flow between adjacent ones of the ribs.

* * * * *